(12) United States Patent
Motz

(10) Patent No.: US 8,390,362 B2
(45) Date of Patent: Mar. 5, 2013

(54) LOW-POWER, HIGH-VOLTAGE INTEGRATED CIRCUITS

(75) Inventor: Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 135 days.

(21) Appl. No.: 12/853,631

(22) Filed: Aug. 10, 2010

(65) Prior Publication Data

US 2012/0038416 A1    Feb. 16, 2012

(51) Int. Cl.
*G05F 3/02* (2006.01)
(52) U.S. Cl. .......................... 327/510; 327/538; 331/67
(58) Field of Classification Search .................. 327/510; 331/67
See application file for complete search history.

(56) References Cited

U.S. PATENT DOCUMENTS

| | | | |
|---|---|---|---|
| 5,212,456 A | 5/1993 | Kovalcik | |
| 5,406,096 A | 4/1995 | Malhi | |
| 5,493,203 A | 2/1996 | Dalton | |
| 5,530,394 A | 6/1996 | Blossfeld | |
| 5,781,074 A * | 7/1998 | Nguyen et al. | 331/105 |
| 6,246,557 B1 | 6/2001 | Bayer | |
| 7,064,407 B1 * | 6/2006 | Mallikarjunaswamy | 257/471 |
| 7,671,489 B1 | 3/2010 | Uy | |
| 7,705,571 B2 | 4/2010 | Motz | |
| 7,928,509 B2 * | 4/2011 | Huang | 257/348 |
| 2003/0112084 A1 * | 6/2003 | Chen et al. | 331/78 |

OTHER PUBLICATIONS

Infineon Technologies AG *Low Power Hall Switch: TLE 4917*, pp. 1-13.

* cited by examiner

*Primary Examiner* — Patrick O'Neill
(74) *Attorney, Agent, or Firm* — Patterson Thuente Christensen Pedersen, P.A.

(57) ABSTRACT

Embodiments relate to an ultra-low-power, high-voltage integrated circuit (IC) that also has high electromagnetic compatibility (EMC). Embodiments address the desire for an ultra-low-power, high-voltage IC that also has high EMC and comprise a high-voltage EMC protection circuit with normal current consumption coupled to an ultra-low-power, low-voltage oscillator that controls a sleep/wake, or duty, cycle of a high-voltage circuit.

26 Claims, 6 Drawing Sheets

LOW-POWER, HIGH-VOLTAGE INTEGRATED CIRCUITS

TECHNICAL FIELD

The invention relates generally to integrated circuits (ICs) and more particularly to ICs having both ultra-low power consumption and high-voltage electromagnetic compatibility (EMC) robustness.

BACKGROUND

Designing an integrated circuit (IC) that has both low current consumption, such as about 100 nano-Amps (nA) to about three micro-Amps (µA), and has high voltage capability, such as about 24 V to about 42 V, while also being robust with respect to electromagnetic compatibility (EMC) has proven challenging in the industry. Desire for such an IC exists for sensor ICs, automotive ICs, industrial ICs and others.

Challenges in such circuits arise from the need for the regulation or control of a high-voltage transistor. Such a transistor can protect the circuit from high voltages and provide EMC immunity but also needs a start-up or bias current, which is desired to be avoided for low power consumption. Further, a starting resistance connected to the external high voltage is also needed, but this resistance is typically large, such as about 420 Mega-Ohms (MΩ) at about 42 V and 0.1 µA, and therefore itself consumes a significant current. At low voltages, such as about 2.5V, and high temperatures, the start-up current is too small with respect to the leakage current, such as less than 50 nA.

While these problems can be avoided in some conventional implementations by standby operation of analog and digital circuits, such implementations require external standby signals and pins. These standby signals and pins are not possible or practical in many applications, and some applications, such as stand-alone sensors, require autonomous wake-up operation. Additionally, while some sensor IC implementations use a standby and awake cycle operation, these are typically low-power sensors and thus are not capable of the desired higher voltages.

Therefore, a need remains for an IC that has both low current consumption and a high voltage capability while also being robust with respect to EMC.

SUMMARY

In an embodiment, an integrated circuit (IC) comprises a load circuit; an oscillator circuit coupled to the load circuit to control a duty cycle of the load circuit and having a current consumption of about 3 micro-Amps (µA) or less; and an electromagnetic compatibility (EMC) protection circuit coupled between the oscillator circuit and a supply voltage and comprising a transistor being one of a high-voltage n-metal-oxide-semiconductor (nMOS) depletion transistor or a high-voltage n-junction field effect transistor (nJFET).

In an embodiment, an IC comprises an electromagnetic compatibility (EMC) protection portion comprising a transistor and a resistor coupled in series, the transistor being one of an n-metal-oxide-semiconductor (nMOS) depletion transistor or an n-junction field effect transistor (nJFET); and an oscillator coupled to the EMC protection portion and having a current consumption of about 3 micro-Amps (µA) or less, a voltage between the EMC protection circuit and the oscillator circuit being about 5 Volts (V) or less.

In an embodiment, a method comprises managing power consumption of a load by coupling an oscillator to the load to control a duty cycle of the load; and providing electromagnetic compatibility (EMC) protection of the load by coupling a transistor and a resistor in series between a supply voltage and the oscillator, the transistor being one of an n-metal-oxide-semiconductor (nMOS) depletion transistor or an n-junction field effect transistor (nJFET).

In an embodiment, an integrated circuit for high-voltage electromagnetic compatibility (EMC) protection comprises a Schottky diode coupled to a supply voltage; and a vertical n-junction field effect transistor (nJFET) coupled in series with the Schottky diode.

BRIEF DESCRIPTION OF THE DRAWINGS

The invention may be more completely understood in consideration of the following detailed description of various embodiments of the invention in connection with the accompanying drawings, in which.

Figure 1:
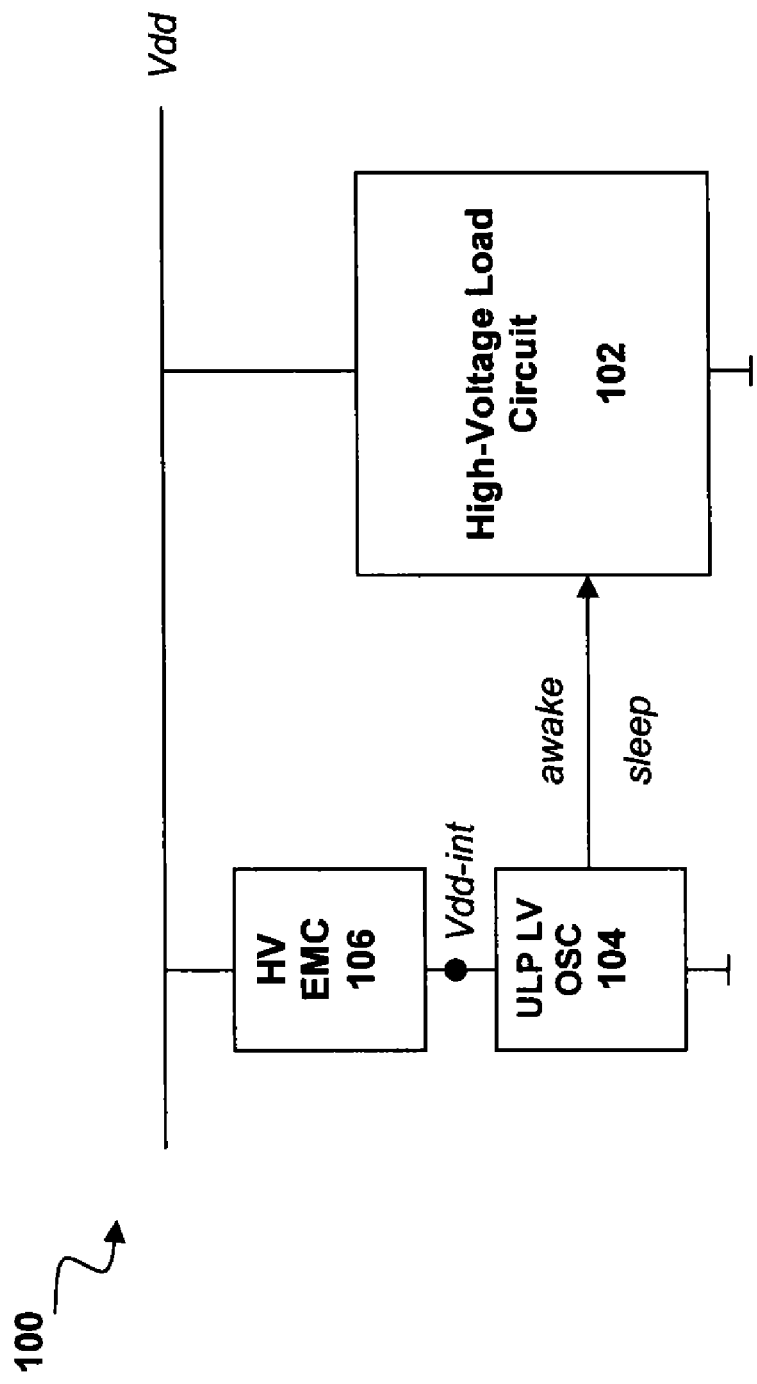
FIG. 1 depicts a block diagram of a circuit according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to an ultra-low-power, high-voltage integrated circuit (IC) that also has high electromagnetic compatibility (EMC). Conventionally, such ICs have been difficult to realize because of a high start-up resistance and additional current draw by EMC protection, defeating the low-power goal of the circuit. Embodiments of an IC discussed herein, however, address the desire for an ultra-low-power, high-voltage IC that also has high EMC and comprise a high-voltage EMC protection circuit with normal current consumption coupled to an ultra-low-power, low-voltage oscillator that controls a sleep/wake, or duty, cycle of a high-voltage circuit.

Referring to FIG. 1, an embodiment of an IC 100 is depicted in block diagram form. IC 100 comprises a high-voltage circuit 102. Circuit 102 is, in embodiments, the operational portion of IC 100, comprising a sensor, a voltage regulator or some other functional, current-consuming circuit for an application. It is desired, however, for circuit 102 to operate in a low-power, low-current consuming manner and to have a high level of EMC protection that does not consume additional current, excluding the very low current for an ultra-low power and low-voltage oscillator.

In an embodiment, these desires are addressed by an ultra-low-power, low-voltage oscillator circuit 104 and a high-voltage EMC protection circuit 106. Oscillator circuit 104 is coupled to circuit 102 and, in operation, controls a wake/sleep duty cycle of circuit 102 to reduce current consumption. In an embodiment, circuit 104 operates at about 30 nA to about 3 μA and only operates at low voltages and/or when biased by a transistor. The start-up current of circuit 104 is supplied by the low-voltage power supply Vdd-int and thus can be kept within relatively narrow limits, such as a range of about 1.5 V to about 3 V, within a range of about 2 V to about 42 V of external power supply Vdd.

Circuit 106 is coupled between circuit 104 and power supply Vdd and comprises a high-voltage EMC protection circuit. In use, circuit 102 operates during a short wake mode controlled by circuit 104 and can easily consume bias currents but is also EMC-protected by circuit 106.

Figure 2:
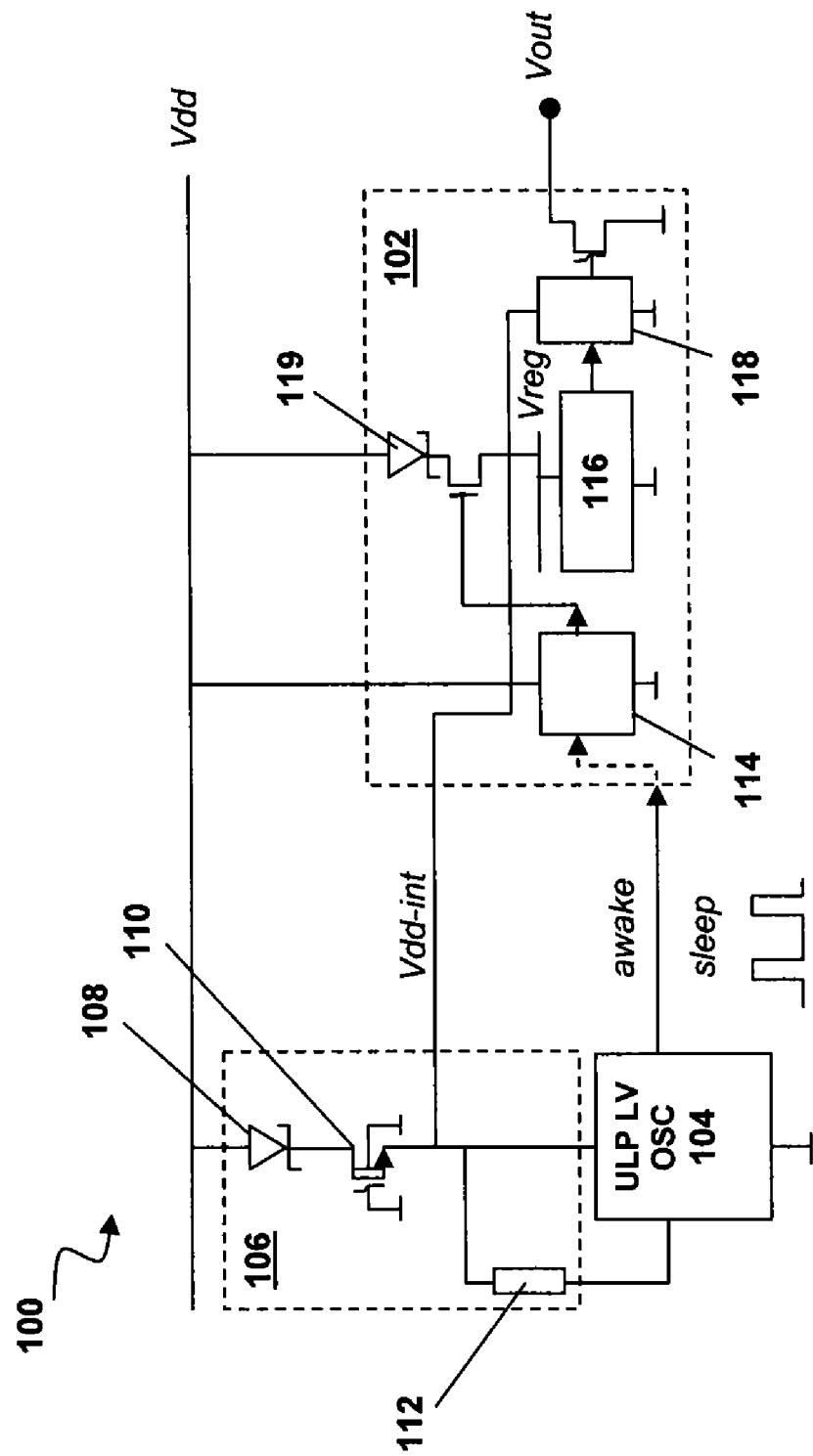
FIG. 2 depicts a block diagram of a circuit according to an embodiment.

Referring to FIG. 2, an embodiment of circuit 106 comprises a Schottky diode 108 coupled in series with a high-voltage transistor 110 and a start-up resistor 112. Transistor 110 provides a low-voltage EMC-protected supply current. In an embodiment, a voltage supplied to circuit 104 is about 1.5 V. Connecting the gate of transistor 110 to ground, the threshold voltage can be observed at the source in case the power supply is larger than the depletion voltage, or negative threshold voltage. If the gate is grounded, a negative threshold voltage can be seen at the source, without additional current consumption, for a positive high voltage. For a negative high voltage, a Schottky diode, an anti-serial high-voltage nMOS depletion transistor or a high-voltage JFET, for example, can be added.

In embodiments, transistor 110 comprises a high-voltage nMOS depletion transistor or a high-voltage JFET. Typical CMOS fabrication does not include depletion transistors, meaning that an additional depletion implant step would be necessary in this technology. In embodiments, however, an nJFET, which has a negative threshold voltage and does not need an additional depletion implant step, is used.

In FIG. 2, circuit 102 comprises a bias or regulator portion 114, a load signal processing portion 116 and a latch 118. Circuit 102 is also coupled to Vdd by a Schottky diode 119, which can provide reverse protection in an embodiment. In other embodiments, some other form of reverse protection can be used, such as an anti-serial high-voltage enhancement or depletion transistors of n-type or p-type.

A latch 118 is connected to Vdd-int or a similar circuit, such as 106, to store information during sleep phases in which Vreg is not provided, in embodiments.

In another embodiment, a second high-voltage nMOS depletion transistor or JFET is added in series between transistor 110 and resistor 112. Such a configuration can provide a constant voltage Vdd-int, such as up to about 3.5 V, for latch 118 and can sustain higher power supply voltages Vdd, such as more than 42 V.

Figure 3A:
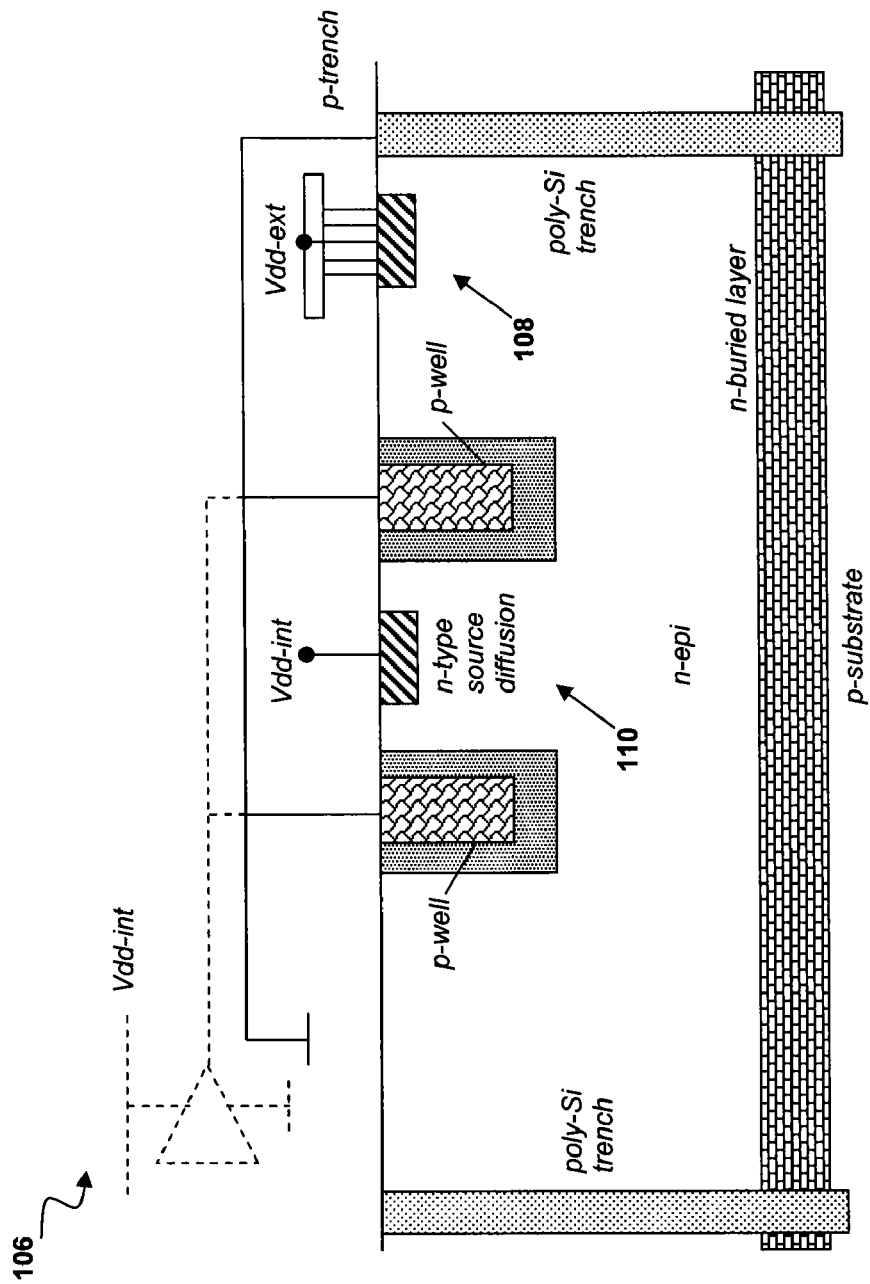
FIG. 3 depicts a block diagram of a circuit according to an embodiment.
Figure 3B:
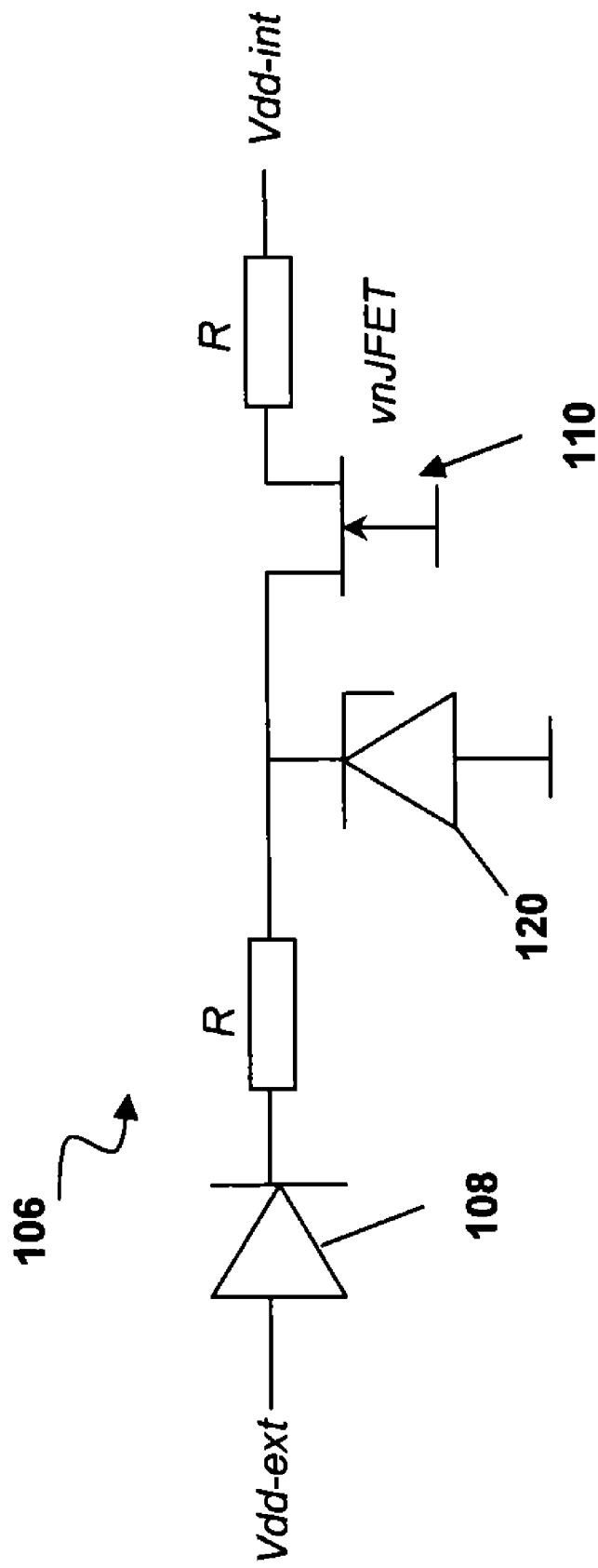

FIG. 3 is another depiction of circuit 106, with FIG. 3A and FIG. 3B being equivalent views. FIG. 3 includes Schottky diode 108 and JFET 110, with serial resistor 112 occurring by current flow through the n-epi and n-buried layer. A parasitic effect with a breakthrough voltage Vbreak, shown as a parasitic diode 120 in FIG. 3B, can also be used for protection purposes. In embodiments, an EMC voltage, Vemc, can be 120 V or more, with Vbreak 80 V or more.

Figure 4:
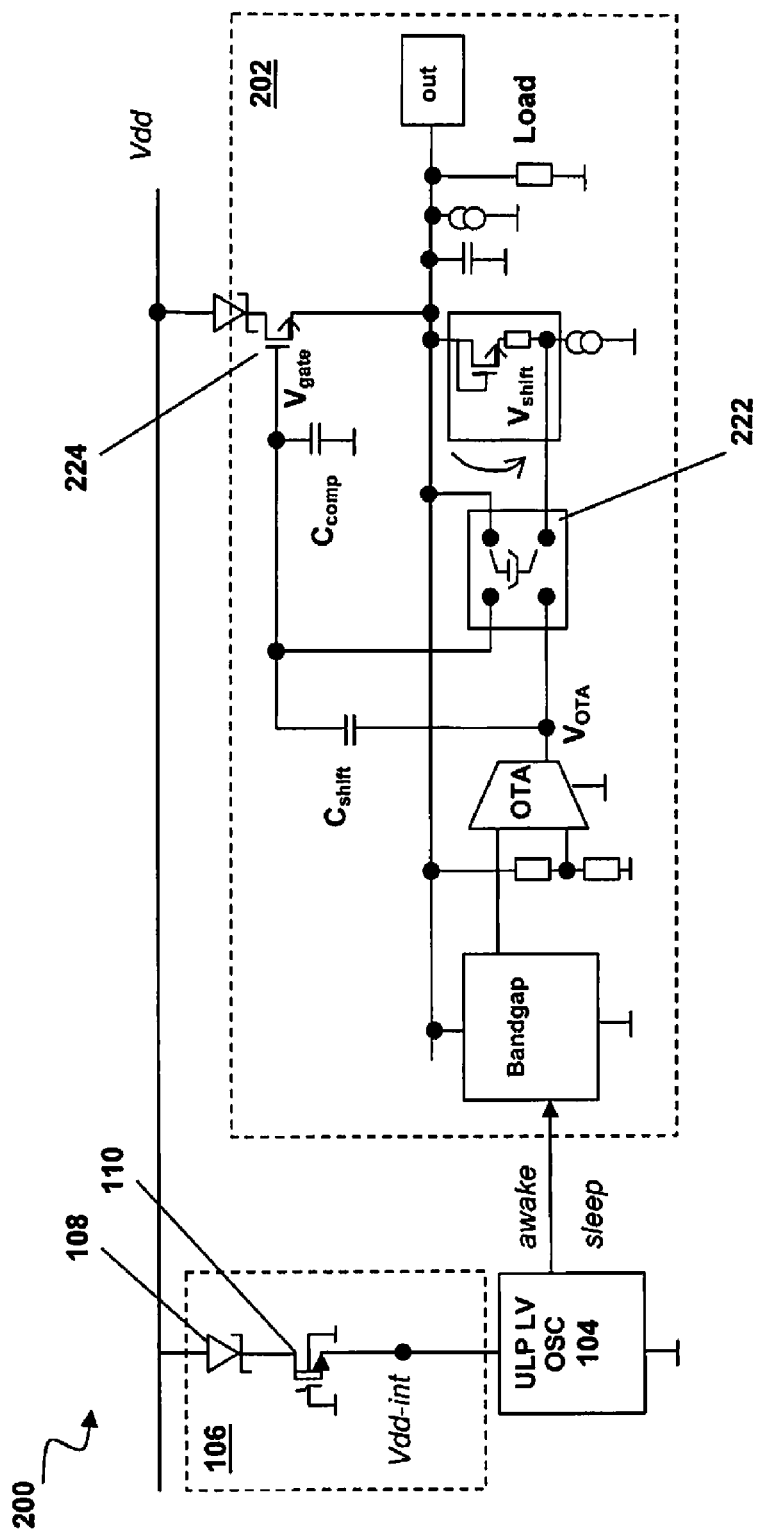
FIG. 4 depicts a block diagram of a circuit according to an embodiment.

Another embodiment is depicted as circuit 200 in FIG. 4, which can be suitable for ultra-low power and EMC with depletion devices and applications, such as in automotive. Similar to circuit 100, circuit 200 includes oscillator circuit 104, which can operate at about 30 nA or 3 μA in embodiments, and circuit 106, which includes an n-depletion high-voltage MOS transistor as depicted or an n-high-voltage JFET. Circuit 200, however, includes another embodiment of a high-voltage circuit 202. Circuit 202 is still controlled, via awake and sleep modes, by oscillator circuit 104 and provided with EMC protection by circuit 106. Circuit 202, however, comprises a configuration of a capacitor $C_{shift}$, a switch 222 and transistor 224, such as a high-voltage nMOS transistor, that simulates a depletion transistor.

Figure 5:
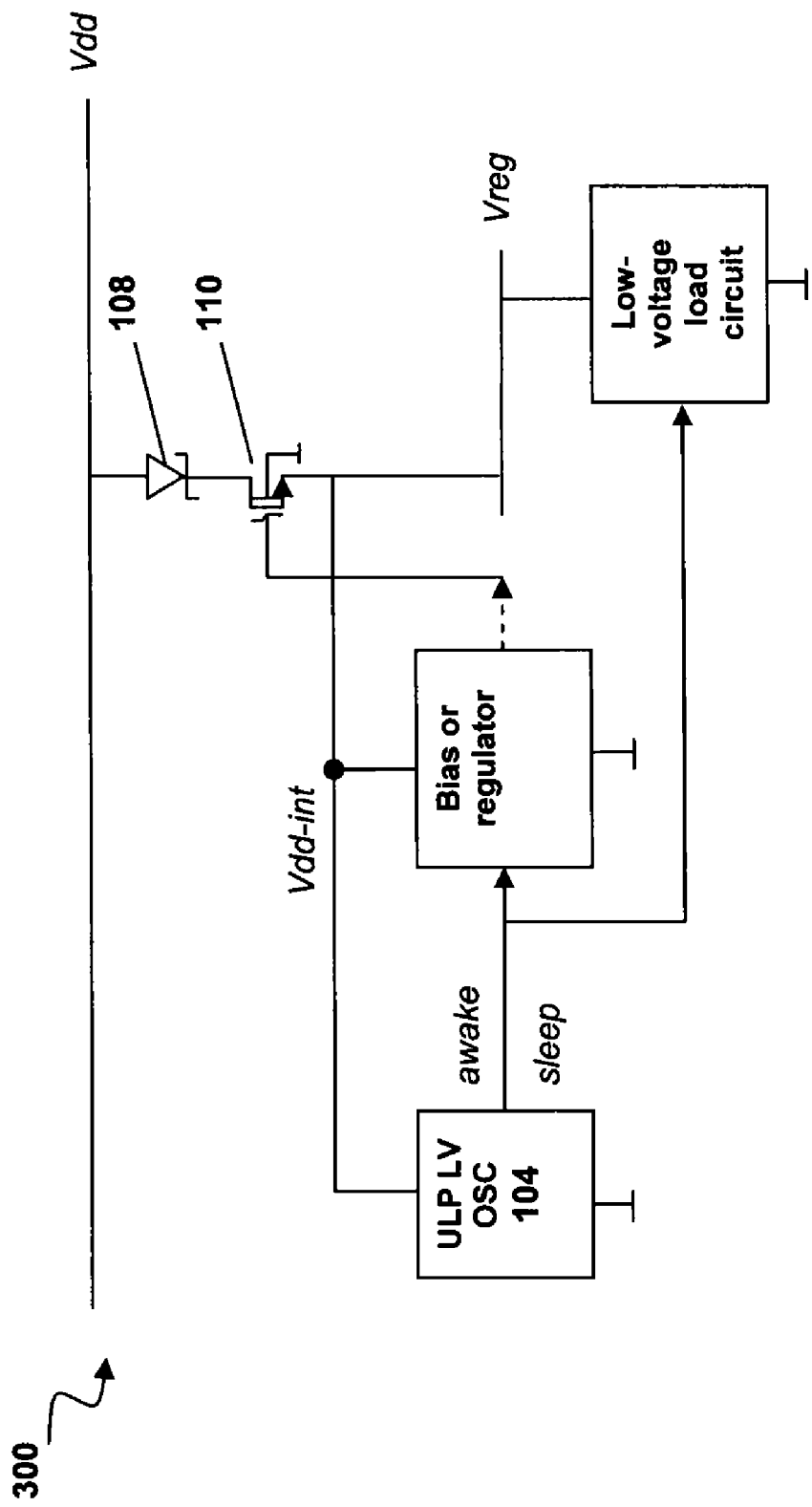
FIG. 5 depicts a block diagram of a circuit according to an embodiment.

Another embodiment is depicted in FIG. 5. Circuit 300 is an embodiment of a high-voltage regulator or high-voltage protected circuit. Circuit 300 includes oscillator circuit 104, which here controls an awake/sleep cycle of a bias or regulator and low-voltage load circuit, as depicted. In an embodiment, oscillator circuit 104 receives a supply voltage, such as about 1.5 V, via a high-voltage nMOS depletion transistor or n-JFET 110 coupled to Vdd by Schottky diode 108. Vreg to the low-voltage load circuit is about 1.5 V to about 3 V in embodiments.

Several advantages are provided by embodiments. For example, the clocking by oscillator circuit 104 enables ultra-low power operation of otherwise high-voltage circuit 102. External triggering is also possible in embodiments. Circuit 106 provides EMC protection of oscillator circuit 104 and circuit 102, including output latch, or latch for internal operation or digital circuit, 118, that needs stored information during a sleep mode, an optional reverse-voltage protection can also be provided. Additionally, the inevitable start-up current of oscillator circuit 104 comes only from the low-voltage supply Vdd-int and thus can be kept within relatively narrow limits and reduces greatly the size and value of a required start-up resistor. Further, the effective yet elegant design also avoids an additional mask step to form a vertical JFET and protection circuits, which provides manufacturing efficiencies and cost savings.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, implantation locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. An integrated circuit (IC) comprising:
a load circuit;
an oscillator circuit coupled to the load circuit to control a duty cycle of the load circuit and having a current consumption of about 3 micro-Amps (µA) or less; and
an electromagnetic compatibility (EMC) protection circuit coupled between the oscillator circuit and a supply voltage and comprising a transistor being one of a high-voltage n-metal-oxide-semiconductor (nMOS) depletion transistor or a high-voltage n-junction field effect transistor (nJFET).

2. The IC of claim 1, wherein the EMC protection circuit further comprises a Schottky diode coupled in series with the transistor.

3. The IC of claim 2, further comprising a resistor coupled in series with the Schottky diode and the transistor.

4. The IC of claim 3, where the resistor is coupled between the transistor and the oscillator circuit.

5. The IC of claim 1, further comprising a Schottky diode coupling the load circuit and the supply voltage.

6. The IC of claim 5, wherein the Schottky diode coupling the load circuit and the supply voltage provides reverse-voltage protection.

7. The IC of claim 1, wherein a voltage provided to the oscillator circuit is about 5 Volts (V) or less.

8. The IC of claim 7, wherein the voltage provided to the oscillator circuit is about 1.5 V.

9. The IC of claim 1, wherein the current consumption of the oscillator circuit is in a range of about 30 nano-Amps (nA) to about 3 micro-amps (µA).

10. The IC of claim 1, wherein the load circuit comprises an output latch.

11. The IC of claim 10, wherein a power supply of the output latch is coupled to a power supply of the oscillator circuit.

12. The IC of claim 10, wherein a power supply of the output latch is a power supply of the oscillator circuit.

13. The IC of claim 1, further comprising one of a depletion transistor circuit or a JFET circuit coupled between the supply voltage and the load circuit.

14. The IC of claim 13, wherein the load circuit comprises a capacitor, a switch and a high-voltage nMOS transistor that together simulate the one of a depletion transistor circuit or a JFET circuit coupled between the supply voltage and the load circuit.

15. The IC of claim 14, further comprising a Schottky diode coupled between the supply voltage and the depletion transistor circuit.

16. The IC of claim 13, further comprising a reverse protection circuit coupled between the supply voltage and the one of a depletion transistor circuit or a JFET circuit, the reverse protection circuit comprising an anti-serial depletion transistor circuit.

17. The IC of claim 13, further comprising a reverse protection circuit coupled between the supply voltage and the load circuit, the reverse protection circuit comprising one of an anti-serial depletion transistor, a pMOS transistor having a high-voltage drain coupled to the supply voltage, or an anti-serial nMOS enhancement transistor.

18. A integrated circuit (IC) comprising:
an electromagnetic compatibility (EMC) protection portion comprising a transistor and a resistor coupled in series, the transistor being one of an n-metal-oxide-semiconductor (nMOS) depletion transistor or an n-junction field effect transistor (nJFET); and
an oscillator coupled to the EMC protection portion and having a current consumption of about 3 micro-Amps (µA) or less, a voltage between the EMC protection circuit and the oscillator circuit being about 5 Volts (V) or less.

19. The IC of claim 18, wherein the EMC protection portion further comprises a Schottky diode coupled in series with the transistor and the resistor.

20. The IC of claim 18, wherein the voltage is about 1.5 V.

21. The IC of claim 18, wherein the oscillator is configured to control a duty cycle of a load.

22. The IC of claim 18, wherein the current consumption of the oscillator is in a range of about 30 nano-Amps (nA) to about 3 micro-Amps (µA).

23. The IC of claim 18, wherein the EMC protection portion is coupled between a supply voltage and the oscillator.

24. A method comprising:
managing power consumption of a load by coupling an oscillator to the load to control a duty cycle of the load; and
providing electromagnetic compatibility (EMC) protection of the load by coupling a transistor and a resistor in series between a supply voltage and the oscillator, the transistor being one of an n-metal-oxide-semiconductor (nMOS) depletion transistor or an n-junction field effect transistor (nJFET).

25. The method of claim 24, wherein providing EMC protection of the load further comprises coupling a Schottky diode in series with the transistor and the resistor.

26. The method of claim 25, wherein the Schottky diode, the transistor, the resistor, the oscillator and the load comprise an integrated circuit (IC).

* * * * *